US008320770B2

(12) United States Patent
Nedovic

(10) Patent No.: US 8,320,770 B2
(45) Date of Patent: Nov. 27, 2012

(54) CLOCK AND DATA RECOVERY FOR DIFFERENTIAL QUADRATURE PHASE SHIFT KEYING

(75) Inventor: Nikola Nedovic, San Jose, CA (US)

(73) Assignee: Fujitsu Limited, Kawasaki-shi (JP)

( * ) Notice: Subject to any disclaimer, the term of this patent is extended or adjusted under 35 U.S.C. 154(b) by 356 days.

(21) Appl. No.: 12/728,756

(22) Filed: Mar. 22, 2010

(65) Prior Publication Data

US 2010/0241918 A1 Sep. 23, 2010

Related U.S. Application Data

(60) Provisional application No. 61/162,202, filed on Mar. 20, 2009.

(51) Int. Cl.
*H04B 10/00* (2006.01)
(52) U.S. Cl. ............. 398/155; 398/154; 398/25; 398/33
(58) Field of Classification Search .................... 398/25, 398/33, 154, 155, 163, 202, 208
See application file for complete search history.

(56) References Cited

U.S. PATENT DOCUMENTS

| | | | |
|---|---|---|---|
| 4,920,278 A | 4/1990 | Nawata | |
| 5,039,889 A | 8/1991 | Janta | |
| 5,343,097 A | 8/1994 | Takeuchi | |
| 6,377,575 B1 * | 4/2002 | Mullaney et al. .............. | 370/360 |
| 6,381,291 B1 | 4/2002 | Yom | |
| 6,426,662 B1 | 7/2002 | Arcus | |
| 6,496,077 B2 | 12/2002 | Ahn | |
| 6,545,507 B1 * | 4/2003 | Goller ............................. | 326/93 |
| 7,012,474 B2 | 3/2006 | Yen | |
| 7,057,435 B2 * | 6/2006 | Mahanavelu et al. ......... | 327/261 |
| 7,142,623 B2 * | 11/2006 | Sorna ............................. | 375/376 |
| 7,265,690 B2 * | 9/2007 | Vining ............................ | 341/68 |
| 7,286,625 B2 | 10/2007 | Lee et al. | |
| 7,386,084 B2 * | 6/2008 | Yin ............................... | 375/371 |
| 7,420,870 B2 | 9/2008 | Park et al. | |

(Continued)

FOREIGN PATENT DOCUMENTS

WO 2008/018034 2/2008

OTHER PUBLICATIONS

Office Action for U.S. Appl. No. 12/511,365, Oct. 25, 2011.

(Continued)

*Primary Examiner* — Li Liu
(74) *Attorney, Agent, or Firm* — Baker Botts L.L.P.

(57) ABSTRACT

In one embodiment, a method includes receiving a first input stream, generating a first clock, sampling the first input stream based on the first clock, detecting a first phase difference between the first input stream and the first clock to generate a clock-correction signal and a first select signal, and generating a first recovered stream based on the first select signal. The method may additionally include receiving a second input stream, generating a second clock, sampling the second input stream based on the second clock, detecting a second phase difference between the second input stream and the second clock to generate a clock-correction signal and a second select signal, and generating a second recovered stream based on the second select signal. The method may further include adjusting the clocks based on the first and second clock-correction signals and combining the first and second recovered data streams to generate an output.

22 Claims, 5 Drawing Sheets

U.S. PATENT DOCUMENTS

| | | |
|---|---|---|
| 7,444,085 B2 | 10/2008 | Ikeuchi |
| 7,446,616 B2 | 11/2008 | Lee |
| 7,489,743 B2 | 2/2009 | Koh et al. |
| 7,535,271 B2 | 5/2009 | Kizer |
| 7,679,453 B2 | 3/2010 | Min |
| 7,737,791 B2 | 6/2010 | Sareen et al. |
| 7,881,419 B2 | 2/2011 | Shin |
| 7,924,071 B2 | 4/2011 | Hiraku |
| 8,058,914 B2 | 11/2011 | Kristensson |
| 8,138,798 B2 | 3/2012 | Nedovic |
| 2002/0131539 A1 | 9/2002 | Li et al. |
| 2003/0189464 A1 | 10/2003 | Drapkin et al. |
| 2003/0198105 A1 | 10/2003 | Yamaguchi |
| 2003/0198311 A1 | 10/2003 | Song et al. |
| 2004/0022339 A1 | 2/2004 | Nakao |
| 2006/0208811 A1 | 9/2006 | Lee |
| 2006/0255866 A1 | 11/2006 | Hirai |
| 2007/0006053 A1 | 1/2007 | Otto |
| 2007/0036257 A1 | 2/2007 | Hu .......................... 375/376 |
| 2007/0041486 A1 | 2/2007 | Shin |
| 2007/0047972 A1* | 3/2007 | Ikeuchi et al. ............ 398/207 |
| 2008/0100364 A1 | 5/2008 | Hiraku |
| 2008/0111634 A1 | 5/2008 | Min |
| 2008/0192873 A1 | 8/2008 | Tamura |
| 2008/0260071 A1 | 10/2008 | Sidiropoulos |
| 2008/0309319 A1 | 12/2008 | Hermann |
| 2009/0009228 A1 | 1/2009 | Jang |
| 2009/0066423 A1 | 3/2009 | Sareen et al. |
| 2009/0125652 A1 | 5/2009 | Huff |
| 2009/0149149 A1 | 6/2009 | Rujis |
| 2009/0237128 A1 | 9/2009 | Qiao |
| 2010/0085086 A1 | 4/2010 | Nedovic |
| 2010/0086075 A1 | 4/2010 | Parikh |
| 2010/0090723 A1 | 4/2010 | Nedovic |
| 2010/0090733 A1 | 4/2010 | Kristensson |
| 2010/0091925 A1 | 4/2010 | Nedovic |
| 2010/0091927 A1 | 4/2010 | Walker |
| 2010/0104057 A1 | 4/2010 | Nedovic |
| 2010/0119024 A1 | 5/2010 | Shumarayev et al. |
| 2010/0266006 A1* | 10/2010 | Werner et al. ............ 375/232 |

OTHER PUBLICATIONS

Scalable SerDes Framer Interface (SFI-S): Implementation Agreement for Interfaces beyond 40G for Physical Layer Devices, IA# OIF-SFI-S-01.0, Nov. 2008.

Von Bueren, George et al, "5.75 to 44Gb/s Quarter Rate CDR with Data Rate Selection in 90nm Bulk CMOS," 34th European Solid-State Circuits Conference, ESSCIRC, 2008.

Savoj, Jafar et al., "Design of Half-Rate Clock and Data Recovery Circuits for Optical Communication Systems," Proceedings of Design Automation Conference, 2001.

Nedovic, N., U.S. Appl. No. 13/424,728, USPTO, Patent Application filed Mar. 20, 2012, *Symmetric Phase Detector*.

Nedovic, N., U.S. Appl. No. 12/510,211, USPTO, Amendment after non-final Office Action filed Dec. 2, 2010.

Nedovic, N., U.S. Appl. No. 12/510,211, USPTO, Notice of Appeal and Pre-Brief Appeal filed Jun. 8, 2011.

Nedovic, N., U.S. Appl. No. 12/510,211, USPTO, Appeal Brief filed Sep. 6, 2011.

Nedovic, N., U.S. Appl. No. 12/510,211, USPTO, Examiner's Answer to Appeal Brief dated Nov. 10, 2011.

Nedovic, N., U.S. Appl. No. 12/510,211, USPTO, Reply Brief filed Jan. 9, 2012.

Nedovic, N., U.S. Appl. No. 12/511,340, USPTO, Amendment after non-final Office Action filed Dec. 28, 2010.

Nedovic, N., U.S. Appl. No. 12/511,340, USPTO, Notice of Allowance dated Jan. 19, 2012.

Nedovic, N., U.S. Appl. No. 12/511,352, USPTO, Amendment after non-final Office Action filed Feb. 8, 2011.

Nedovic, N., U.S. Appl. No. 12/511,352, USPTO, Notice of Allowance dated Aug. 23, 2011.

Walker, W.., U.S. Appl. No. 12/511,365, USPTO, Amendment after non-final Office Action filed Jan. 20, 2012.

Walker, W., U.S. Appl. No. 12/511,365, USPTO, Supplemental Amendment to Office Action filed Mar. 5, 2012.

Walker, W., U.S. Appl. No. 12/511,365, USPTO, Non-final Office Action dated Mar. 29, 2012.

Parikh, S., U.S. Appl. No. 12/511,917, USPTO, Non-final Office Action dated May 29, 2012.

Nedovic, N., U.S. Appl. No. 13/424,728, USPTO, Non-final Office Action dated Apr. 26, 2012.

Dally, William et al., "Digital Systems Engineering," Cambridge University Press, Cambridge, UK, 2008.

Office Action for U.S. Appl. No. 12/511,352, Oct. 29, 2010.

Office Action for U.S. Appl. No. 12/510,211, Feb. 10, 2011.

SerDes Framer Interface Level 5 Phase 2 (SFI-5.2): Implementation Agreement for *40Gb/s* Interface for Physical Layer Devices, IA# OIF-SFI5-02.0, Oct. 2, 2006.

Hanumolu, P. K. et al., "A Wide-Tracking Range Clock and Data Recovery Circuit", *IEEE JSSC*, 43:2, Feb. 2008.

Lee, J. et al., "A 40-Gb/s Clock and Data Recovery Circuit in O.18-/-tm CMOS Technology", IEEE Journal of Solid-State Circuits, 38:12, Dec. 2003.

Nedovic, N. et al., "A 40-44Gb/s 3x Oversampling CMOS CDR/1:16 DEMUX", ISSCC Digest of Technical Papers, 2007.

Staszewski, R. B. et al, "All-Digital TX Frequency Synthesizer and Discrete-Time Receiver for Bluetooth Radio in 130-nm CMOS", *IEEE JSSC*, 39:12, Dec. 2004.

Office Action for U.S. Appl. No. 12/510,211, Aug. 23, 2010.

Office Action for U.S. Appl. No. 12/511,340, Sep. 28, 2010.

USPTO Notice of Allowance and Fees Due for U.S. Appl. No. 12/510,199, Jun. 14, 2012.

\* cited by examiner

CLOCK AND DATA RECOVERY FOR DIFFERENTIAL QUADRATURE PHASE SHIFT KEYING

RELATED APPLICATION

This application claims the benefit, under 35 U.S.C. §119(e), of U.S. Provisional Patent Application No. 61/162,202, entitled Clock and Data Recovery for Differential Quadrature Phase Shift Keying, filed 20 Mar. 2009.

TECHNICAL FIELD

The present disclosure relates generally to clock and data recovery (CDR).

BACKGROUND

CDR circuits (or systems) are generally used to sample an incoming data signal, extract the clock from the incoming data signal, and retime the sampled data. A phase-locked loop (PLL)-based CDR circuit is a conventional type of CDR circuit. A PLL circuit is an electronic control system that may be used, in part or in whole, to generate or maintain one signal that is locked onto the phase and frequency of another signal. By way of example, in a conventional PLL-based CDR, a phase detector compares the phase between input data bits from a serial input data stream and a clock signal generated by a voltage-controlled oscillator (VCO). In response to the phase difference between the input data and the clock, the phase detector generates phase or frequency correction signals. A charge pump drives a current to or from a loop filter according to the correction signals. The loop filter generates a control voltage $V_{CTRL}$ for the VCO based on the current driven by the charge pump. The loop acts as a feedback control system that tracks the phase and frequency of the input data stream with the phase and frequency of the clock that the loop generates.

DESCRIPTION OF EXAMPLE EMBODIMENTS

Figure 1:
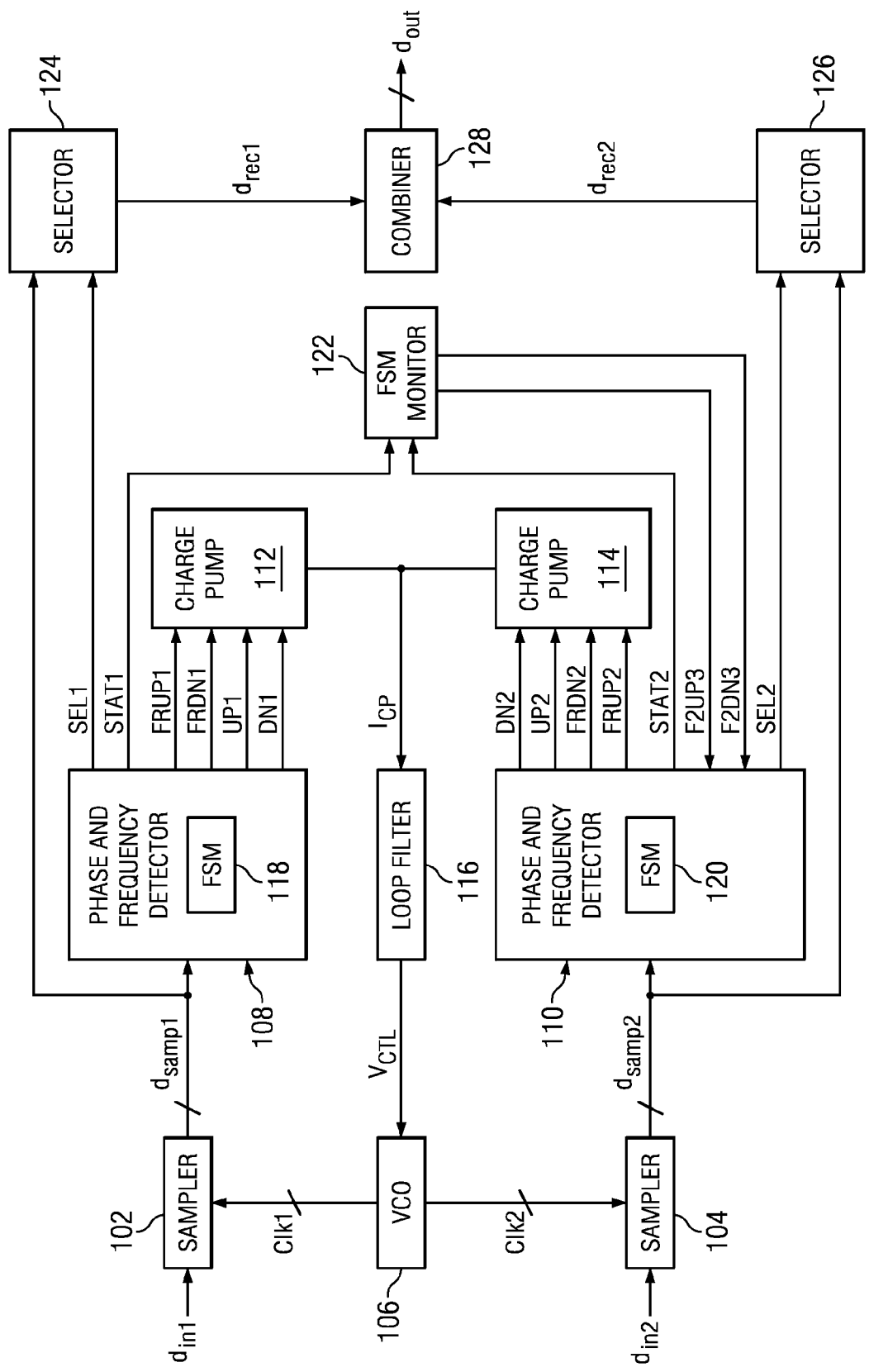
FIG. 1 illustrates an example CDR architecture.

Particular embodiments relate to an electronic circuit, device, or system for clock and data recovery (CDR) for a serial communication system application. More particularly, the present disclosure provides examples of a CDR architecture that takes two input data bit streams and produces one or more output data bit streams in which the bits from the two input data bit streams are interleaved. In particular embodiments, an example CDR circuit oversamples each of the two input data bit streams by an oversampling factor of at lease 3, enabling respective phase and frequency detectors to detect bit transition points in the respective sampled data bit streams and effectively determine both the magnitudes and directions of any phase or frequency shifts between respective recovered clock signals used to sample the input data bits and the input data bit streams themselves. In particular embodiments, an example CDR circuit additionally includes two selectors that each select one of the samples taken for each bit in the respective input data bit streams, and output the selected samples as respective recovered data bit streams to a combiner that combines the recovered data bit streams to output one or more output data bit streams that, in particular embodiments, reconstruct the values and ordering of the bits in an original symbol stream from which the two input data bit streams were generated. In particular embodiments, an example CDR circuit further includes a monitor that receives phase state information from each of the phase and frequency detectors, which the monitor then uses to detect or determine any DC phase offset between the two input bit streams themselves, and which may then compensate for any detected DC phase offset by instructing one of the phase and frequency detectors or corresponding sample selectors to skip one or more bits in the respective sampled data bit stream thereby eliminating the DC phase offset in the subsequently generated recovered data bit streams and ensuring proper ordering of the bits in the one or more output data bit streams.

Generally, various described embodiments can be used for any two-input CDR application; however, particular embodiments relate to the use of a CDR architecture within a deserializer utilized in optical communication. By way of example, particular embodiments may be utilized in a Differential Quadrature Phase Shift Keying (DQPSK) optical transponder. In particular embodiments, the two input data bit streams have the same data rate and are each generated by demodulating or decoding a DQPSK modulated symbol stream in which each symbol of the DQPSK symbol stream encodes two bits. However, alternative embodiments may be utilized in other specific applications and for non-optical communication (e.g., hard-wired communication using electrons), where appropriate. Particular embodiments may be utilized in high speed communication systems (e.g., data bit rates greater than 10 Gigabits per second (Gb/s)) and in even more particular embodiments, in communication systems having data rates at or exceeding 20 Gb/s or 40 Gb/s. Particular embodiments may be implemented with a complementary metal-oxide-semiconductor (CMOS) architecture. As used herein, one stream may refer to one wire, and vice versa, where appropriate. Furthermore, as used herein, "or" may imply "and" as well as "or;" that is, "or" does not necessarily preclude "and," unless explicitly stated or implicitly implied.

FIG. 1 illustrates an example CDR system, device, or circuit 100 ("CDR 100"). CDR 100 is configured to receive first input data bits from a first input data bit stream $d_{in1}$ and second input data bits from a second input data bit stream $d_{in2}$. In particular embodiments, each of the first and second input data bit streams $d_{in1}$ and $d_{in2}$ is generated by demodulating or decoding a single symbol stream, and each includes input data bits at an input data bit frequency (in this example, the input data bit frequency is half the data bit frequency of the symbol stream from which the two input data bit streams were generated). In particular embodiments, the symbol stream is a Differential Quadrature Phase Shift Keying (DQPSK) modulated data stream. In particular embodiments, and as described in the present disclosure, the first input data bits in the first input data bit stream $d_{in1}$ may be even-numbered bits from the DQPSK symbol stream while the second input data bits in the second input data bit stream $d_{in2}$ may be odd-numbered bits from the DQPSK symbol stream (or vice versa); that is, for example, the first bit of each demodulated symbol from the DQPSK symbol stream may be output to the first input data bit stream $d_{in1}$ while the second bit of each demodulated symbol from the DQPSK symbol stream may be output to the second input data bit stream $d_{in2}$. In particular embodiments, each of first and second input data bit streams $d_{in1}$ and $d_{in2}$ is transmitted in the form of a differential signal (e.g., a signal that is formed by the difference of a data signal and its complement).

Figure 2:
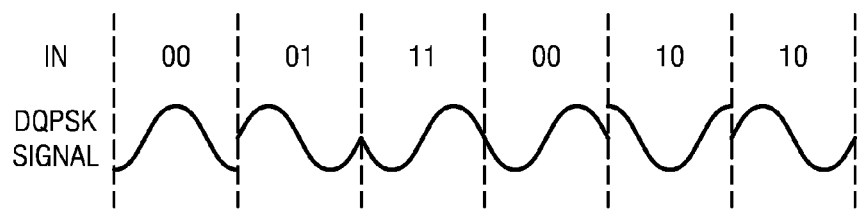
FIG. 2 illustrates an example differential quadrature phase shift keying (DQPSK) modulation scheme.

DQPSK is a modulation technique in which two bits at a time are grouped and used to phase-modulate an output. By way of example, in an example implementation, 2 bits per symbol are encoded in the phases of light. The modulation is differential, which means that the input symbol (two bits) corresponds not to a particular phase of the output, but to the change of the phase relative to the phase of the previous symbol. FIG. 2 illustrates an example DQPSK modulation scheme. In the example illustrated in FIG. 2, symbol 00 causes zero change in the output phase, symbol 01 causes a phase change of $\pi/2$, symbol 11 causes a phase change of $\pi$, and symbol 10 causes a phase change of $\pi/2$. In this way the demodulation may be made insensitive to a phase shift in the communication medium.

A DQPSK receiver demodulates the DQPSK symbol stream to obtain two bits per symbol, and thus two streams of binary data, $d_{in1}$ and $d_{in2}$, which may then be amplified and sent to CDR 100. The two input data streams $d_{in1}$ and $d_{in2}$ have the same data rate (input data bit frequency), but the exact phase relationship between the two input data streams $d_{in1}$ and $d_{in2}$ is unknown due to, for example, mismatches in the paths from the DQPSK demodulator to CDR 100. A proper CDR circuit should not only recover the clock and individual data, but also correctly recombine the recovered bits from the two input data bit streams; that is, determine which bits from $d_{in1}$ and $d_{in2}$ correspond to the same corresponding symbols from the DQPSK symbol stream and output these bits in the proper order as they were received from the DQPSK symbol stream.

In the embodiment illustrated in FIG. 1, CDR 100 includes samplers 102 and 104 for sampling, and more particularly oversampling, input data bit streams $d_{in1}$ and $d_{in2}$, respectively. In particular embodiments, each of samplers 102 and 104 oversample the respective input data bit stream $d_{in1}$ or $d_{in2}$ by a factor of n (although each of samplers 102 and 104 are illustrated as a single circuit block or element, each of samplers 102 and 104 may generally include n individual samplers or sampling elements, each receiving $d_{in1}$ or $d_{in2}$, respectively). In particular embodiments, the oversampling factor n has an integer value that is greater than or equal to 3 (3 being the minimum oversampling factor that enables the described phase and frequency detectors to detect bit transition points and to determine the magnitude and direction of any phase offset between an input data bit stream and the clock used to sample it). A voltage-controlled oscillator (VCO) 106 generates multiphase clock signals Clk1 and Clk2 each having the same clock frequency but not necessarily the same constituent phases. In particular embodiments, each of multiphase clock signals Clk1 and Clk2 is actually a set of n clock signals of one of n different phases to provide each of samplers 102 and 104 with n clock signals of n different phases such that samplers 102 and 104 may sample input data bit streams $d_{in1}$ and $d_{in2}$, respectively, n times per clock cycle to generate oversampled sample streams $d_{samp1}$ and $d_{samp2}$, respectively (note that in a particular implementation, each of sample streams $d_{samp1}$ and $d_{samp2}$, respectively, may actually be output as n associated individual sample streams over n wires such that each individual sample stream has a data rate equal to that of the respective input data bit stream from which it was sampled). Ideally, as is a goal of CDR 100, each bit from each of input data bit streams $d_{in1}$ and $d_{in2}$ is sampled n times per clock cycle, and in particular embodiments, after a boundary (edge) of the respective immediately previous bit (in time), at a center of the bit, and before a boundary of the respective immediately following bit (in time).

CDR 100 also includes a phase and frequency detector 108 that receives the $d_{samp1}$ and Clk1 signals and which is configured to detect phase or frequency differences between $d_{samp1}$ and Clk1. Similarly, CDR 100 also includes a phase and frequency detector 110 that receives the $d_{samp2}$ and Clk2 signals and which is configured to detect phase or frequency differences between $d_{samp2}$ and Clk2. Phase and frequency detector 108 may generate one or more phase or frequency correction signals that are then output to charge pump 112. Similarly, phase and frequency detector 110 may generate one or more phase or frequency correction signals that are then output to charge pump 114. In particular embodiments, based on the phase or frequency correction signals received from phase and frequency detectors 108 and 110, charge pumps 112 and 115 affect the raising, lowering, or maintaining of a responding current $I_{CP}$, which is filtered by loop filter 116. Loop filter 116 generally affects the dynamic behavior of the feedback loop and filters out any high frequency noise associated with the current $I_{CP}$ output from the charge pumps 112 and 115. Loop filter 116 outputs a control voltage $V_{CTL}$ based on $I_{CP}$ that controls the frequency and phases of the clock signals Clk1 and Clk2 output from VCO 106 (thereby forming the feedback loop mentioned above). In such a manner, CDR 100 is configured to receive input data bit streams $d_{in1}$ and $d_{in2}$, and over a number of iterations, generate clock signals Clk1 and Clk2 that match the frequencies and phases of input data bit streams $d_{in1}$ and $d_{in2}$ without the need for an external reference clock required by conventional CDR circuits, as described in further detail below.

In particular embodiments, phase and frequency detectors 108 and 110 receive input data bit streams $d_{in1}$ and $d_{in2}$, respectively, and essentially compare the phases of input data bit streams $d_{in1}$ and $d_{in2}$ to the phases of clock signals Clk1 and Clk2, respectively. For example, if phase and frequency detector 108 detects a phase difference between input data bit stream $d_{in1}$ and clock signal Clk1, phase and frequency detector 108 may generate a phase correction signal to adjust the phase of clock signal Clk1 (and inherently causing the same phase change in Clk2). The phase correction signals generated by phase and frequency detector 108 may be implemented by transmitting or asserting one of two signals, an up signal ("UP1") or a down signal ("DN1") where an UP1 signal is used to increase the current $I_{CP}$ to thereby increase the phase and frequency of clock signal Clk1 (and Clk2) and a DN1 signal is used to decrease the current $I_{CP}$ to thereby decrease the phase and frequency of clock signal Clk1 (and Clk2). Generally, the phase correction signals UP1 and DN1 have equal but opposite effects on the current $I_{CP}$; that is, UP1 may increase the current $I_{CP}$ by the same magnitude that DN1 would decrease it. Similarly, if phase and frequency detector 110 detects a phase difference between input data bit stream $d_{in2}$ and clock signal Clk2, phase and frequency detector 110 may generate a phase correction signal to adjust the phase of clock signal Clk2 (and inherently having the same effect on Clk1). The phase correction signals generated by phase and frequency detector 110 may be implemented by transmitting or asserting one of two signals, an up signal ("UP2") or a down signal ("DN2") where an UP2 signal is used to increase the current $I_{CP}$ to thereby increase the phase and frequency of clock signal Clk2 (and Clk1) and a DN2 signal is used to decrease the current $I_{CP}$ to thereby decrease the phase and frequency of clock signal Clk2 (and Clk1). Again, generally, the phase correction signals UP2 and DN2 have equal but opposite effects on the current $I_{CP}$; that is, UP2 may increase the current $I_{CP}$ by the same magnitude that DN2 would decrease it. As will be described in more detail below, there may be instances where phase and frequency detector 108 and phase and frequency detector 110 transmit opposing signals. For example, phase and frequency detector 108 may output an UP1 signal while phase and frequency detector 110 outputs a DN2 signal, or conversely, phase and frequency detector 108 outputs a DN1 signal while phase and frequency detector 110 outputs an UP2 signal. In particular embodiments, the phase correction signals UP1 and UP2 have equal effects on the current $I_{CP}$. Similarly, the phase correction signals DN1 and DN2 have equal effects on the current $I_{CP}$. Hence, if phase and frequency detector 108 asserts UP1 while phase and frequency detector 110 asserts DN2, or similarly, phase and frequency detector 108 asserts DN1 while phase and frequency detector 110 asserts UP2, there would be no net increase or decrease in $I_{CP}$ (in this way, phase discrepancies resulting from high frequency noise are averaged out). Likewise, if phase and frequency detector 108 asserts UP1 and phase and frequency detector 110 asserts UP2, the net increase in $I_{CP}$ may be double that of the increase if only one of UP1 and UP2 was asserted (and neither DN1 nor DN2 was asserted), and similarly, if phase and frequency detector 108 asserts DN1 while phase and frequency detector 110 asserts DN2, the net decrease in $I_{CP}$ may be double that of the decrease if only one of DN1 and DN2 was asserted (and neither UP1 nor UP2 was asserted).

In particular embodiments, each of phase and frequency detectors 108 and 110 includes a finite state machine (FSM). In particular embodiments, phase and frequency detector 108 attempts to maintain the phase between input data bit stream $d_{in1}$ and clock signal Clk1 by using FSM 118 to analyze and track samples of input data bit stream $d_{in1}$ obtained by sampler 102. Similarly, phase and frequency detector 110 attempts to maintain the phase between input data bit stream $d_{in2}$ and clock signal Clk2 by using FSM 120 to analyze and track samples of input data bit stream $d_{in2}$ obtained by sampler 104. FSM 118 and FSM 120 may each comprise any suitable components or devices of hardware or logic or a combination of two or more such components or devices operable to track one or more phase states. In particular embodiments, each phase state tracked by FSM 118 or FSM 120 is respectively related to an amount of phase displacement (or phase difference) between the corresponding clock signal Clk1 or Clk2 and the corresponding input data bit stream $d_{in1}$ or $d_{in2}$, respectively. In one example embodiment, each of FSM 118 and FSM 120 may include a First In First Out (FIFO) buffer. However, the present disclosure contemplates the use of any suitable component or combination of components operable to track one or more phase states, each phase state being respectively related to an amount of phase displacement between two signals.

Samplers 102 and 104 may each include any component or components of hardware or logic capable obtaining samples of input data bit streams $d_{in1}$ and $d_{in2}$, respectively. As an example, each of samplers 102 and 104 may be implemented with one or more master-slave latches or sense amplifier-based latches (generally n latches for each of samplers 102 and 104). In particular embodiments, as described above, the sampling rate of each of samplers 102 and 104 is determined by the clock signals Clk1 and Clk2, respectively (although the frequencies of Clk1 and Clk2 are the same in particular embodiments). More particularly, the positions and frequency of the samples taken by each of samplers 102 and 104 relative to input data bit streams $d_{in1}$ and $d_{in2}$, respectively, may be determined by the phases and frequency of clock signals Clk1 and Clk2 relative to input data bit streams $d_{in1}$ and $d_{in2}$, respectively. As an example, if the frequency of clock signal Clk1 is greater than the frequency (bit rate) of input data bit stream $d_{in1}$, sampler 102 may obtain more than the nominal number (n) of samples per each bit. Likewise, if the frequency of clock signal Clk2 (which has the same frequency as Clk1 in particular embodiments) is greater than the frequency (bit rate) of input data bit stream $d_{in2}$, sampler 104 may obtain more than the nominal number (n) of samples per each bit. Similarly, if the frequency of clock signal Clk1 is less than the frequency (bit rate) of input data bit stream $d_{in1}$, sampler 102 may obtain fewer than the nominal number (n) of samples per each bit. Likewise, if the frequency of clock signal Clk2 is less than the frequency (bit rate) of input data bit stream $d_{in2}$, sampler 104 may obtain fewer than the nominal number (n) of samples per each bit. Additionally, a misalignment of the phases of clock signal Clk1 and the phase of input data bit stream $d_{in1}$ (or similarly, a misalignment of the phases of clock signal Clk2 and the phase of input data bit stream $d_{in2}$) may cause a misalignment of the samples taken by sampler 102 (or sampler 104 respectively) relative to the bits in input data bit stream $d_{in1}$ (or $d_{in2}$ respectively); that is, for example, sampler 102 (or sampler 104 respectively) may take samples from the wrong positions (e.g., not at the center and near the boundaries) of a particular bit, or in more extreme cases of phase misalignment, may take one or more samples from the wrong bit altogether.

In particular embodiments, as described in more detail below, FSM 118 and FSM 120 may analyze the samples in $d_{samp1}$ and $d_{samp2}$, respectively, received from samplers 102 and 104, respectively, to determine whether there is a phase (or frequency) difference between input data bit stream $d_{in1}$ and clock signal Clk1 or between input data bit stream $d_{in2}$ and clock signal Clk2, respectively, and record any such phase difference as a change in state in FSM 118 or FSM 120, respectively (each of FSM 118 and FSM 120 records changes in state independently for their respective clock signals and input data bit streams). That is, each state of FSM 118 represents a detected phase difference between clock signal Clk1 and input data bit stream $d_{in1}$, while each state of FSM 120 represents a detected phase difference between clock signal Clk2 and input data bit stream $d_{in2}$. Based on a state change in FSM 118 or FSM 120 (as each of FSM 118 and FSM 120 record changes in states for their respective clock and input data bit stream signals independently, in some instances only one of FSM 118 and FSM 120 may record a state change in a given clock cycle, in other instances, neither may record a state change in a given clock cycle, and in still other instances, both may record a state change, which may or not be in the same direction, in a given clock cycle), FSM 118 or FSM 120, respectively, may assert phase correction signals (e.g., UP1 or DN1 for FSM 118 and UP2 or DN2 for FSM 120) to alter the control voltage $V_{CTL}$ input to VCO 106 until the phases of clock signal Clk1 or Clk2, respectively, matches the phase of input data bit stream $d_{in1}$ or input data bit stream $d_{in2}$, respectively (in other words, for an oversampling factor of 3, the samples taken for each bit are taken within the UI near the boundaries of the bit and at the center of the bit), in which case, FSM 118 or FSM 120 will transition to a predetermined state that indicates a phase match between the corresponding clock and input data bit stream signals. By continuously tracking and recording phase discrepancies between clock signal Clk1 and input data bit stream $d_{in1}$ as state transitions in FSM 118, and similarly, continuously tracking and recording phase discrepancies between clock signal Clk2 and input data bit stream $d_{in2}$ as state transitions in FSM 120, and by iteratively asserting phase correction signals to adjust the phase of clock signal Clk1 and Clk2 until the respective FSM 118 or FSM 120 transitions to the respective predetermined state that indicates a phase match between their corresponding signals, phase and frequency detectors 108 and 110 may acquire and/or maintain the phases and frequencies of clock signals Clk1 and Clk2 and input data bit streams $d_{in1}$ and $d_{in2}$ even over a wide range of phase drifts between the clock signals Clk1 and Clk2 and input data bit streams $d_{in1}$ and $d_{in2}$, respectively. Additionally, it should be noted that, in the described embodiments, each of FSM 118 and FSM 120 operate independently; however, a phase correction signal (or frequency correction signal as described below) asserted by either affects the phases and frequencies of both Clk1 and Clk2 equally, as Clk1 and Clk2, in particular embodiments, are both generated by VCO 106 which operates based on the single control voltage $V_{CTL}$, which, in turn, is based on the current $I_{CP}$, which is affected by the phase and frequency correction signals supplied to both of charge pumps 112 and 114.

In particular embodiments, CDR 100 may use FSM 118 and FSM 120 in conjunction with samplers 102 and 104, respectively, to acquire the frequency (data rate) of input data bit streams $d_{in1}$ and $d_{in2}$ (the input data bit streams $d_{in1}$ and $d_{in2}$ have the same frequency in particular embodiments) without the use of an additional reference clock required by conventional CDR circuits (e.g., without the need to first synchronize Clk1 or Clk2 with a predetermined reference clock signal to roughly match the frequency of Clk1 and Clk2 to within a threshold range of the input data bit frequency of $d_{in1}$ and $d_{in2}$). For example, when a frequency difference exists between clock signal Clk1 and input data bit stream $d_{in1}$, the samples from sampler 102 may cause FSM 118 to unidirectionally change states until FSM 118 reaches an underflow or overflow state. Likewise, when a frequency difference exists between clock signal Clk2 and input data bit stream $d_{in2}$, the samples from sampler 104 may cause FSM 120 to unidirectionally change states until FSM 120 reaches an underflow or overflow condition or state. For example, an underflow or overflow of FSM 118 or FSM 120 may occur if the progression of state changes being tracked by FSM 118 or FSM 120, respectively, exceeds the number of states in FSM 118 or FSM 120, respectively. When an underflow or overflow condition is reached by FSM 118 or FSM 120, FSM 118 or FSM 120, respectively, may interpret such activity as a frequency discrepancy between clock signal Clk1 and input data bit stream $d_{in1}$ or a frequency discrepancy between clock signal Clk2 and input data bit stream $d_{in2}$, respectively. In such instances, whichever of FSM 118 and FSM 120 is experiencing the underflow or overflow condition (generally both FSM 118 and FSM 120 will overflow or underflow together as, in the described example embodiments, the frequencies of Clk1 and Clk2 are the same and the data rates of $d_{in1}$ and $d_{in2}$ are the same) may assert one or more frequency correction signals to alter the frequency of VCO 106 until the frequency of clock signal Clk1 (and Clk2) matches the frequency of the input data bit streams $d_{in1}$ and $d_{in2}$. When the frequency of input data bit stream $d_{in1}$ matches the frequency of clock signal Clk1, FSM 118 will stop overflowing or underflowing and will cease asserting frequency correction signals. Likewise, when the frequency of input data bit stream $d_{in2}$ matches the frequency of clock signal Clk2, FSM 120 will stop overflowing or underflowing and will cease asserting frequency correction signals. Additionally, after phase and frequency detectors 108 and 110 have acquired the frequency of input data bit stream $d_{in1}$ and $d_{in2}$ (e.g., stopped underflowing or overflowing), FSM 118 and FSM 120 may continue to operate in phase detection mode as described above in order to acquire or maintain the phase of the corresponding clock and input data bit stream signals.

The frequency correction signals generated by phase and frequency detector 108 may be implemented by transmitting or asserting one of two signals, an up signal ("FRUP1") or a down signal ("FRDN1") where an FRUP1 signal is used to increase the current $I_{CP}$ to thereby increase the frequency of clock signal Clk1 (and Clk2) and a FRDN1 signal is used to decrease the current $I_{CP}$ to thereby decrease the frequency of clock signal Clk1 (and Clk2). Generally, the frequency correction signals FRUP1 and FRDN1 have equal but opposite effects on the current $I_{CP}$; that is, FRUP1 may increase the current $I_{CP}$ by the same magnitude that FRDN1 would decrease it. Similarly, the frequency correction signals generated by phase and frequency detector 110 may be implemented by transmitting or asserting one of two signals, an up signal ("FRUP2") or a down signal ("FRDN2") where an FRUP2 signal is used to increase the current $I_{CP}$ to thereby increase the frequency of clock signal Clk2 (and Clk1) and a FRDN2 signal is used to decrease the current $I_{CP}$ to thereby decrease the frequency of clock signal Clk2 (and Clk1). Again, generally, the frequency correction signals FRUP2 and FRDN2 have equal but opposite effects on the current $I_{CP}$. Additionally, in particular embodiments, the frequency correction signals FRUP1 and FRUP2 have equal effects on the current $I_{CP}$. Similarly, the frequency correction signals FRDN1 and FRDN2 have equal effects on the current $I_{CP}$. In particular embodiments, the frequency correction signals FRUP1, FRDN1, FRUP2, and FRDN2 are similar to the phase correction signals UP1, DN1, UP2, and DN2, respectively, described above, with the exception of the magnitude of the increase or decrease in the current $I_{CP}$; that is, the frequency corrections signals cause larger changes in the current $I_{CP}$ (e.g., the assertion of a frequency correction signal may result in 10 times the current change resulting from the assertion of a phase correction signal), thereby resulting in larger changes in $V_{CTL}$, and in turn, larger changes in the frequencies and phases of clock signals CLK1 and CLK2.

Figure 3:
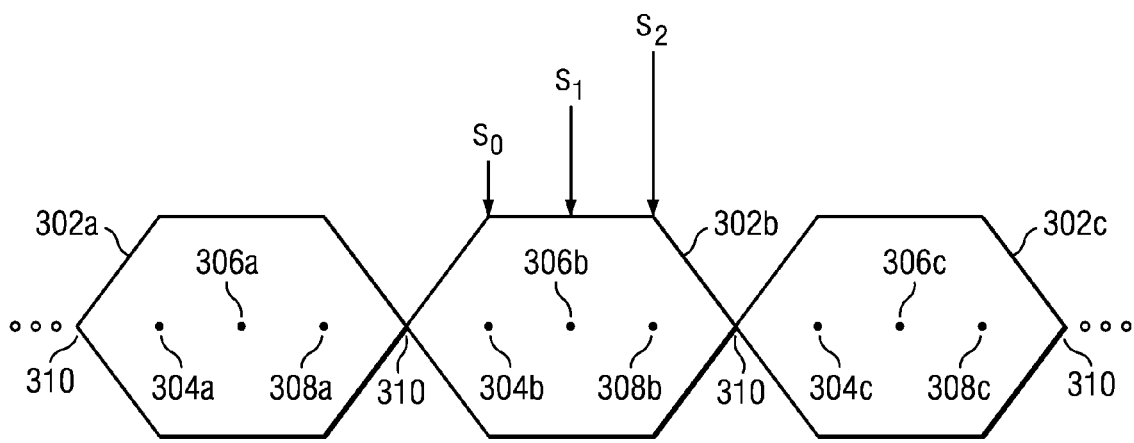
FIG. 3 illustrates three consecutive example bits of data.

FIG. 3 illustrates three consecutive example bits of data 302 (shown as bits 302a, 302b, and 302c). For illustrative purposes and ease of explanation, it is assumed the example bits 302 are from input data bit stream $d_{in1}$ (although one of ordinary skill in the art will appreciate that the following example description described with reference to FIGS. 3-6 may be equally applied to input data bit stream $d_{in2}$ and corresponding sampler 104, phase and frequency detector 110, FSM 120, and charge pump 114). In the following example, it is assumed that sampler 102 oversamples input data bit stream $d_{in1}$ using an oversampling factor of 3. For explanatory purposes, bit 302b represents the bit to be sampled at a particular instant ("the target bit") when CDR 100 is properly calibrated (e.g., when the phase and frequency of clock signal Clk1 and input data bit stream $d_{in1}$ match). In the example 3× oversampling scheme, each of bits 302a, 302b, and 302c, may have a first sampling position 304a, 304b, and 304c, respectively, a second sampling position 306a, 306b, and 306c, respectively, and a third sampling position 308a, 308b, and 308c, respectively. As an example and not by way of limitation, the first sampling positions 304a, 304b, and 304c, may denote sampling positions immediately following transition points (boundaries or edges) 310 from the previous bit, the second sampling positions 306a, 306b, and 306c, may denote sampling positions located at the temporal center of each bit (e.g., the center of the "eye" of the data), and the third sampling positions 308a, 308b, and 308c, may denote sampling positions immediately preceding a transition point 310 to the next bit. The following example description assumes that bits 302 enter sampler 102 from left to right (e.g., bit 302a enters first, bit 302b enters second, and bit 302c enters last).

The temporal length of each bit 302 (e.g., pictorially represented as the distance from one transition point 310 to the next transition point 310) may be referred to as a Unit Interval (UI). When properly calibrated for 3× oversampling, CDR 100 obtains 3 samples per UI (e.g., 3 samples per bit 302). Accordingly, the temporal space between each sample position for 3× oversampling is ⅓ of a UI. As an example and not by way of limitation, the UI for 1 bit of data in a 40 Gigabits per second (Gbps or Gb/s) input data bit stream $d_{in1}$ would be 25 picoseconds (ps). Moreover, if sampled at 3× oversampling, the temporal space between each sample (e.g., between sample S0 and sample S1 or between sample S1 and sample S2) would be approximately 8.3 ps.

When used in a 3× oversampling scheme, sampler 102 may respectively obtain three samples (e.g., a first sample S0, a second sample S1, and a third sample S2) of each bit 302 as each bit 302 passes through sampler 102. When the phase and frequency of clock signal Clk1 matches the phase and frequency of input data bit stream $d_{in1}$, each sample continually aligns with the same predetermined location of each bit 302 (e.g., samples S0, S1, S2 respectively align with positions 304b, 306b, and 308b assuming bit 302b is the target bit being sampled).

However, the phase of clock signal Clk1 may drift from the phase of input data bit stream $d_{in1}$ or may otherwise fail to match the phase of input data bit stream $d_{in1}$. When the phase of Clk1 does not match the phase of the input data bit stream $d_{in1}$, the temporal positions of the samples obtained by sampler 102 (e.g., sample S0, sample S1, and sample S2) may not align with their predetermined positions (e.g., position 304, position 306, and position 308). For example, assuming that bit 302b is the target bit and the phase of clock signal Clk1 drifts such that the phase of Clk1 lags behind the phase of input data bit stream $d_{in1}$ by, for example, ⅓ of a UI, sample S1 will align with position 308b rather than with the center of the eye of the data (e.g., position 306b) and will continue to be so misaligned until the phase of clock signal Clk1 is increased by ⅓ of a UI (that is, each clock signal of multiphase clock signal Clk1 is increased by ⅓ of a UI).

In particular embodiments, a phase misalignment (phase difference) between clock signal Clk1 and input data bit stream $d_{in1}$ may be recorded as a change in state of FSM 118 (similarly, a phase misalignment between clock signal Clk2 and input data bit stream $d_{in2}$ may be recorded as a change in state of FSM 120), where each state of FSM 118 (and FSM 120 respectively) may indicate a particular degree of phase misalignment. As an example and not by way of limitation, state "0" may indicate that the phase of clock signal Clk1 matches the phase of input data bit stream $d_{in1}$, state "+1" may indicate that the phase of clock signal Clk1 lags behind the phase of input data bit stream $d_{in1}$ by ⅓ of a UI, and state "−1" may indicate that the phase of clock signal Clk1 leads the phase of input data bit stream $d_{in1}$ by ⅓ of a UI, etc. One of ordinary skill in the art will appreciate that the relationship between the states of FSM 118 and the phase displacements between clock signal Clk1 and input data bit stream $d_{in1}$ are presented for the sake of explanatory simplicity and will further appreciate that the present disclosure contemplates the use of any such relationship suitable to indicate the degree of phase misalignment between clock signal Clk1 and input data bit stream $d_{in1}$.

Figure 4:
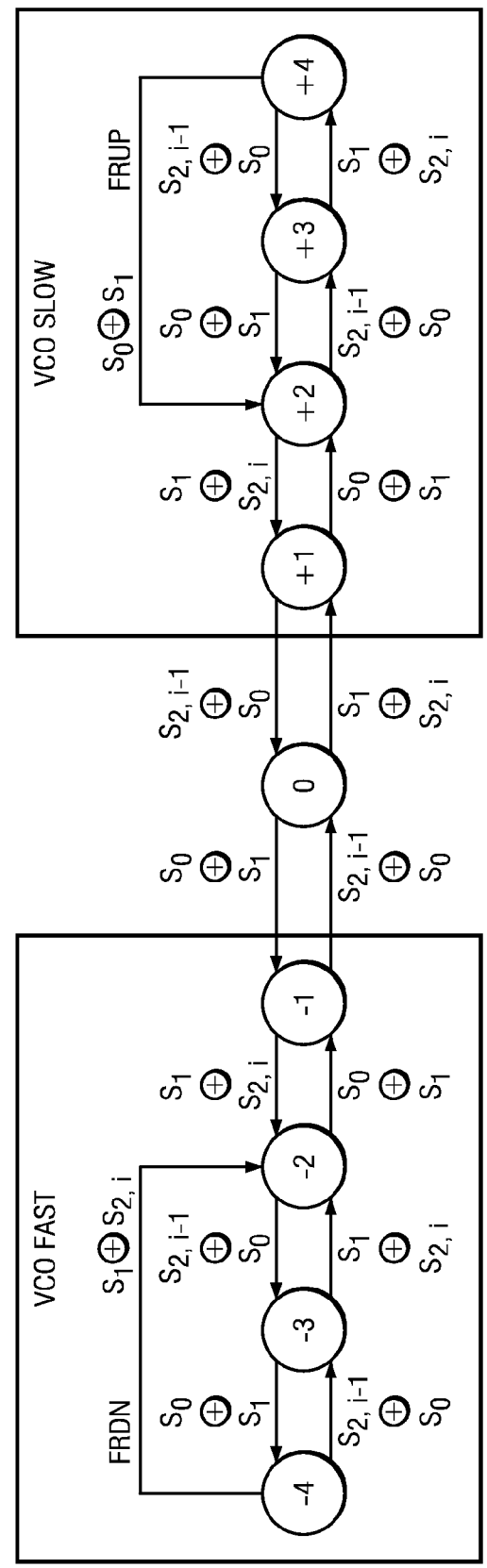
FIG. 4 illustrates an example state scheme implemented by an example finite state machine.

FIG. 4 illustrates an example state scheme that may be implemented by FSM 118 and, in particular embodiments, independently for FSM 120, for frequency and phase acquisition in accordance with the present disclosure. In particular embodiments, each of FSM 118 and FSM 120 may be accompanied by a FIFO having nine available entries (e.g., one entry for each of the states −4, −3, −2, −1, 0, +1, +2, +3, +4). Referring to FSM 118 for ease of explanation (although one of skill in the art will readily be able to apply the following description to FSM 120 and respective signals Clk2 and $d_{in2}$), in particular embodiments, the states −4, −3, −2, −1, 0, +1, +2, +3, and +4 may respectively correspond to phase errors between input data bit stream $d_{in1}$ and clock signal Clk1 of −⁴⁄₃ UI, −³⁄₃ UI, −²⁄₃ UI, −⅓ UI, 0, ⅓ UI, ⅔ UI, ³⁄₃ UI, and ⁴⁄₃ UI, where negative states designate that clock signal Clk1 is faster than input data bit stream $d_{in1}$ and positive states designate that clock signal Clk1 is slower than input data bit stream $d_{in1}$. As initially described above with reference to FIG. 3, each state in FSM 118 (and FSM 120) may be associated with the location of a particular sample (e.g. sample S1) relative to the center of the eye of the data (e.g., position 306b). As an example and not by way of limitation, when the phase and frequency of clock signal Clk1 matches the phase and frequency of input data bit stream $d_{in1}$, sample S1 should be properly aligned with the center of the eye of the data (as represented in FIG. 3). When sample S1 is proper aligned with position 306, samples S0, S1, and S2 should ideally have identical values (e.g., either all "1's" or all "0's") since all three samples are taken from the same bit 302 with no transition points 310 occurring between sample S0 and S1 or between S1 and S2.

In an example embodiment, to track the position of each sample S1 with respect to the center of the eye of the respective data bits from input data bit stream $d_{in1}$, FSM 118 (and similarly for FSM 120 and the samples from input data bit stream $d_{in2}$) may exclusively OR ("XOR") one or more of the surrounding samples to ascertain whether any transition points 310 have occurred at unexpected temporal locations. By performing an XOR function on the samples surrounding sample S1, FSM 118 (and FSM 120) may use the point of transition from one bit to the next (e.g., transition point 310) to determine and record the location of sample S1 relative to the center of the eye of the data.

As an example and not by way of limitation, when FSM 118 (and equally for FSM 120) is in state "0," FSM 118 (or FSM 120 respectively) may XOR sample S0 and sample S1 to determine whether the value of sample S0 matches the value of sample S1. If the value of sample S0 matches the value of sample S1, then FSM 118 (or FSM 120 respectively) may determine that no data transition has taken place between sample S0 and sample S1 and may remain in state "0." If the value of sample S0 does not match the value of sample S1, then FSM 118 (or FSM 120 respectively) may determine that a data transition has taken place between sample S0 and sample S1 and may accordingly change state from state "0" to state "−1." State "−1" may indicate that the phase of Clk1 is leading the phase of input data bit stream $d_{in1}$ by ⅓ UI, and that sample S1 is currently located 1 position ahead of the center of the eye of the data (e.g., aligned with position 304b rather than position 306b).

During the next sampling cycle, FSM 118 (and FSM 120 respectively) may repeat the above-described process taking into account the new position of sample S1 with respect to the center of the eye of the data. As an example and not by way of limitation, when FSM 118 (or FSM 120) is in state "−1," FSM 118 (or FSM 120 respectively) may XOR sample S1 and sample S2,i to determine whether a data transition has occurred between sample S1 and sample S2,i. Sample S2,i may be used to refer to sample S2 of the same bit (e.g., bit 302b) while sample S2,i-1 may be used to refer to sample S2 of the previous bit (e.g., bit 302a). If such a data transition has occurred (e.g., if the value of sample S1 does not match the value of sample S2,i) then FSM 118 (or FSM 120 respectively) may move from state "−1" to state "−2," thus indicating that the phase of Clk1 (or Clk2 respectively) is leading the phase of input data bit stream $d_{in1}$ (or input data bit stream $d_{in2}$ respectively) by ⅔ of a UI (e.g., indicating that sample S1 is aligned with position 308a rather than position 306b).

As another example and not by way of limitation, FSM 118 (or FSM 120), when in state "0," may XOR sample S1 and sample S2,i to determine whether a data transition has occurred between sample S1 and sample S2,i. If a data transition has occurred (e.g., if the value of sample S1 does not match the value of sample S2,i) then FSM 118 (or FSM 120 respectively) may move from state "0" to state "+1" indicating that the phase of Clk1 (or Clk2 respectively) is lagging the phase of input data bit stream $d_{in1}$ (or input data bit stream $d_{in2}$ respectively), and that sample S1 is currently located one position behind the center of the eye of the data (e.g., aligned with position 308b rather than position 306b).

When two bits of identical value are adjacent to one another (e.g., if sample 306a is a "1" and sample 306b is a "1"), FSM 118 (or FSM 120) may not be able to identify a data transition by performing an XOR function on the samples taken from bit 302a and 302b since both bits have identical values. However, such an occurrence will not affect the functionality of CDR 100 since FSM 118 and sampler 102 (or FSM 120 and sampler 104, respectively) will continue in their normal operation pending the arrival of the next detectable data transition point 310. By continually applying the above-described state detection scheme, FSM 118 (and FSM 120) may use its states to keep track of the current positions of samples S1 with respect to the centers of the eyes of the data bits from input data bit stream $d_{in1}$ (and input data bit stream $d_{in2}$ respectively).

When FSM 118 (or FSM 120) changes state in response to a phase difference between clock signal Clk1 and input data bit stream $d_{in1}$ (or between clock signal Clk2 and input data bit stream $d_{in2}$, respectively), FSM 118 (or FSM 120 respectively) may assert a phase correction signal (e.g., UP1 or DN1 for FSM 118 or UP2 or DN2 for FSM 120) to adjust the phase of Clk1 to compensate for the difference. As an example and not by way of limitation, if the phase of clock signal Clk1 is leading the phase of input data bit stream $d_{in1}$ by ⅓ of a UI, FSM 118 may assert the DN1 signal to decrease the phase of Clk1 by ⅓ of a UI, thus allowing FSM 118 to transition from state "−1" to state "0" once the phase adjustment has propagated through CDR 100. As another example and not by way of limitation, if the phase of clock signal Clk1 is lagging behind the phase of input data bit stream $d_{in1}$ by ⅓ of a UI, FSM 118 may assert the UP1 signal to increase the phase of Clk1 by ⅓ of a UI, thus allowing FSM 118 to transition from state "+1" to state "0" once the phase adjustment has propagated through CDR 100.

In particular embodiments, the conditions under which FSM 118 (and FSM 120) may assert a phase correction signal (e.g., the method of asserting phase correction signals and the number of phase correction signals to be asserted) may be predetermined by a user. As an example and not by way of limitation, FSM 118 (and FSM 120) may assert a phase correction signal after remaining in a single state for more than "x" cycles in order to low-pass filter the phase error signal. As an additional example and not by way of limitation, FSM 118 (and FSM 120) may not assert a phase correction until it reaches a particular state (e.g., state "+2"), after which FSM 118 (or FSM 120 respectively) may begin asserting phase correction signals. As an additional example, a different combination of the respective phase correction signals may be asserted depending on the particular states of FSM 118 and FSM 120, so that the total current supplied by charge pumps 112 and 114, respectively, becomes proportional to the state (and therefore the phase error) in order to achieve a more linear characteristic of phase and frequency detectors 108 and 110. One of ordinary skill in the art will appreciate that the present disclosure contemplates using any suitable conditions to trigger the phase correction signals from FSM 118 and FSM 120.

In particular embodiments, each of FSM 118 and FSM 120 may only be permitted to transition between its respective states on a one-by-one basis. This may be implemented so that each of FSM 118 and FSM 120 interprets a respective data transition between two respective particular samples as being caused by the smallest incremental amount of phase shift between clock signals Clk1 and Clk2 and input data bit stream $d_{in1}$ and input data bit stream $d_{in2}$, respectively, that would cause such a data transition. For example, if FSM 118 is in state "+1", and the incoming samples are such that S0 XOR S1=1 (e.g., indicating there is a transition between sample S0 and sample S1), this data transition could reflect a number scenarios with respect to the phase of clock signal Clk1 relative to the phase of input data bit stream $d_{in1}$. For instance, such a data transition could occur if: a) clock signal Clk1 went from being slower than input data bit stream $d_{in1}$ by ⅓ UI to being slower than input data bit stream $d_{in1}$ by ⅔ UI (e.g., corresponding to a change from state "+1" to state "+2"), b) clock signal Clk1 went from being slower than input data bit stream $d_{in1}$ by ⅓ UI to being faster than input data bit stream $d_{in1}$ by ⅓ UI (e.g., corresponding to a change from state "+1" to state "−1"), c) clock signal Clk1 went from being slower than input data bit stream $d_{in1}$ by ⅓ UI to being faster than input data bit stream $d_{in1}$ by ⅘ UI (e.g., corresponding to a change from state "+1" to state "−4"), etc. While all three scenarios described above would cause a data transition between sample S0 and Si when FSM 118 is in state "+1," the state scheme employed by FSM 118 (and similarly for FSM 120) assumes that scenario (a) is the most likely scenario and therefore FSM 118 will interpret the transition point as a change in state from state "+1" to state "+2." Consequently, in particular embodiments, each of FSM 118 and FSM 120 is only permitted to transition between adjacent states when a respective transition point is detected so that FSM 118 and FSM 120 interprets a transition point between two respective particular samples as being caused by the smallest incremental amount of phase shift between respective clock signals Clk1 and Clk2 and the respective input data bit streams $d_{in1}$ and $d_{in2}$ that would cause such a respective transition.

Since each state in each of FSM 118 and FSM 120 may describe the position of a respective sample S1 relative to the center of the eye of the data in input data bit streams $d_{in1}$ and $d_{in2}$, respectively, a change of more than one state at a time may result in one or more samples being skipped or missed in order to realign sample the respective samples S1 with the eye of the data. For example, a change from state "+2" directly to state "0" would correspond to a relocation of sample S1 from position 308a to position 306b. Consequently, when operating within the range of state "−4" to state "+4," FSM 118 and FSM 120 may be configured to only assert phase correction signals which will only transition sequentially between states. However, in some alternate embodiments in which, for example, the oversampling factor is greater, such as, for example, n=5, FSM 118 and FSM may be configured to assert phase correction signals that may cause a transition by one or more states in response to a single assertion of a phase correction signals (e.g., jumps in steps of +/−1 or +/−2 since these are more probable scenarios than the jumps of +/−4 or +/−3 in the other direction).

However, if FSM 118 or FSM 120 overflows (e.g., if a change in state occurs outside of state "+4," generally if one of FSM 118 or FSM 120 overflows, the other will overflow at the same time or soon after depending on the input data bits in the respective input data bit streams) or underflows (e.g., if a change in state occurs outside of state "−4," generally if one of FSM 118 or FSM 120 underflows, the other will underflow at the same time or soon after depending on the input data bits in the respective input data bit streams), then FSM 118 or FSM 120, respectively, may assert frequency correction signals (e.g., FRUP1 or FRDN1 for FSM 118 and FRUP2 or FRDN2 for FSM 120) that will effectively change the frequency of Clk1 and Clk2 to relocate the respective samples S1 by more than one position. As an example and not by way of limitation, if FSM 118 is operating in state "+4" (e.g., the outermost state on the positive side) and subsequently detects a data transition that would require FSM 118 to transition beyond state "+4" (e.g., if the value of sample S1 does not match the value of sample S0), FSM 118 may assert a FRUP1 signal to compensate for the overflow. In turn, the FRUP1 signal will increase the frequency of Clk1 (and inherently Clk2 by the same amount in particular embodiments) and FSM 118 may transition from state "+4" to "+2" thus skipping a bit. In such an example instance, FSM 118 may continue to apply FRUP1 signals for each subsequent overflow until the frequency of Clk1 matches the frequency of input data bit stream $d_{in1}$.

Once the frequency of Clk1 matches the frequency of input data bit stream $d_{in1}$, and inherently, in particular embodiments, the frequency of Clk2 matches the frequency of input data bit stream $d_{in2}$, each of FSM 118 and FSM 120 may cease overflowing or underflowing and may continue operating within the range of states "−4" to "+4" to provide phase correction as described above to compensate for any phase difference between clock signals Clk1 and Clk2 and input data bit streams $d_{in1}$ and $d_{in2}$, respectively. One of ordinary skill in the art will appreciate that the above-described state detection scheme of FSM 118 and FSM 120 has been described with respect to an embodiment in which each of the input data bit streams are sampled by an oversampling factor of 3 for the sake of explanatory simplicity and will further appreciate that the present disclosure contemplates CDR 100 using a similar state detection scheme adapted to any suitable oversampling factor greater than or equal to 3 (e.g., 4, 8, etc.), as an oversampling factor of 3 is required in particular embodiments to detect transition points and thereby track phase discrepancies in FSM 118 and FSM 120. One of ordinary skill in the art will further appreciate that the number of states in state machine 250 has been limited to nine for the sake of explanatory simplicity and will further appreciate that the present disclosure contemplates the use of any suitable number of states in each of FSM 118 and FSM 120.

Figure 5:
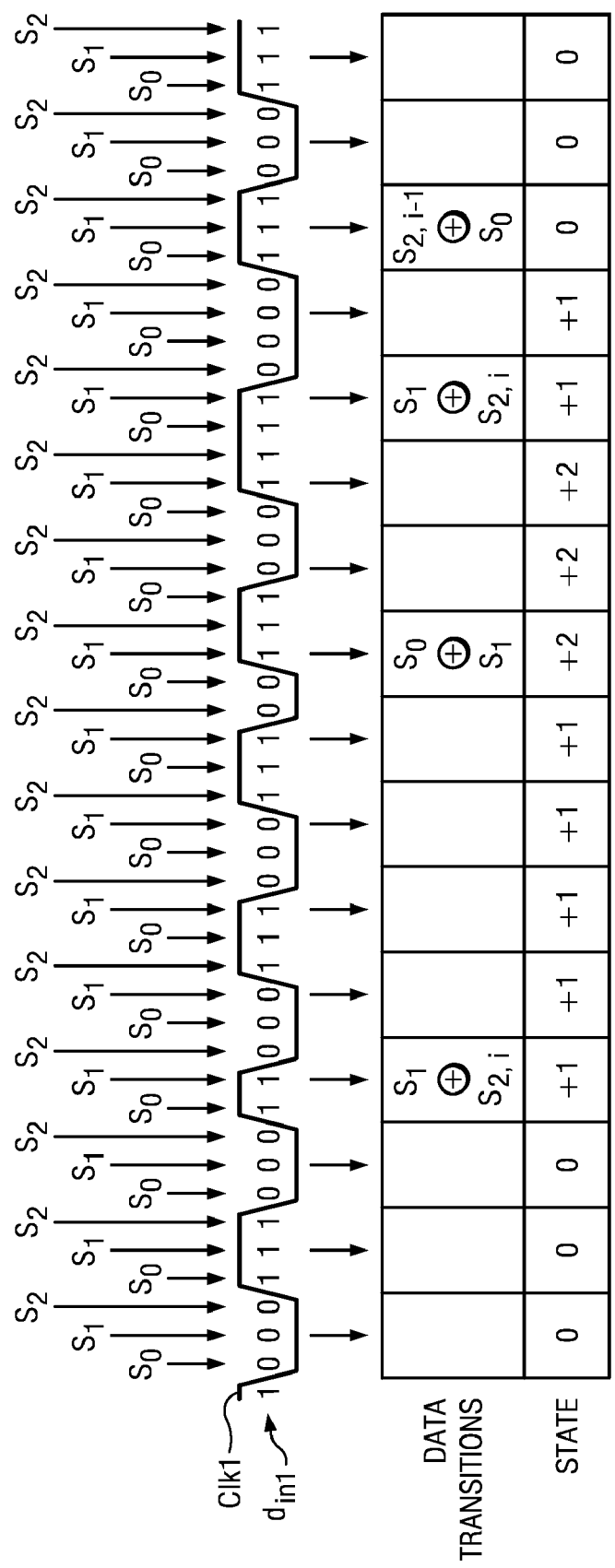
FIG. 5 illustrates an example operation of an example finite state machine used in acquiring or maintaining a phase relationship between an input data bit stream and a clock signal.
Figure 6:
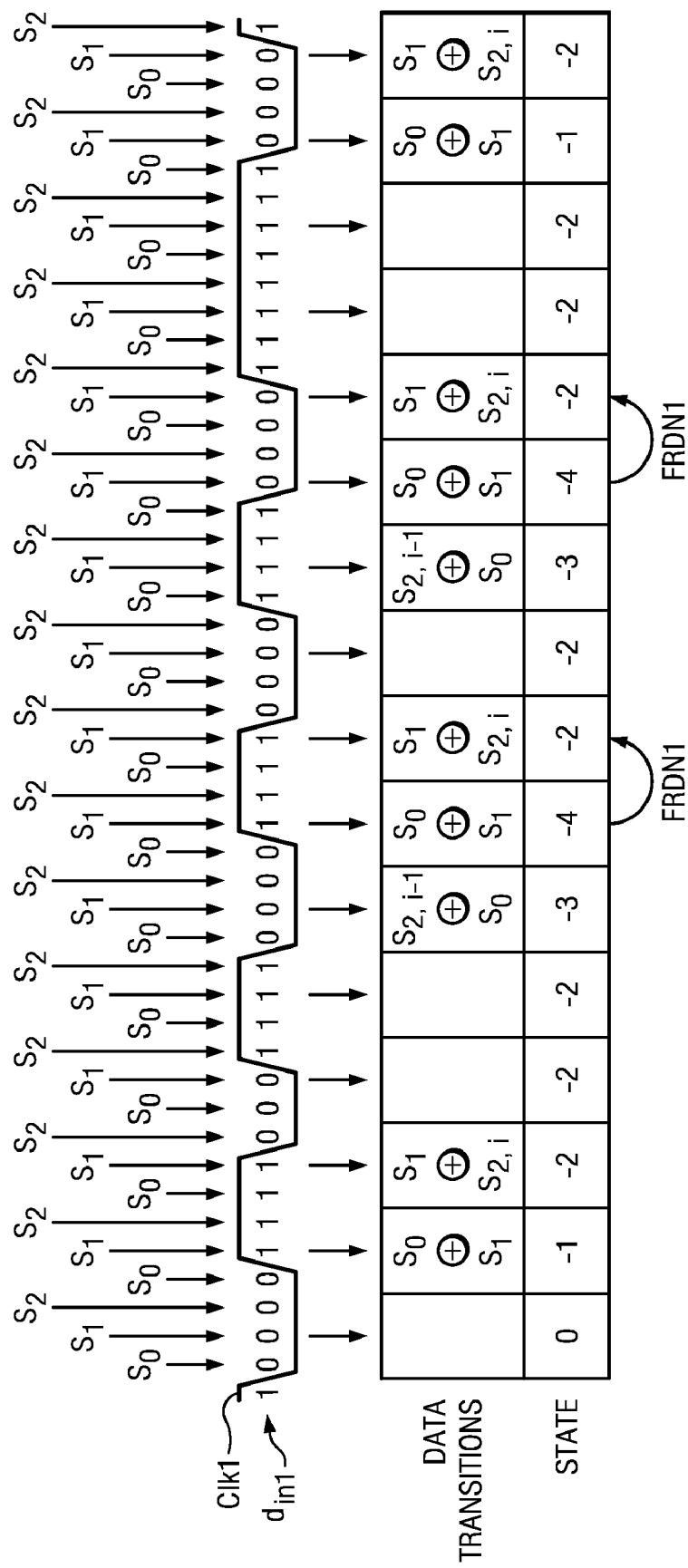
FIG. 6 illustrates an example operation of an example finite state machine used in acquiring or maintaining a frequency relationship between an input data bit stream and a clock signal.

FIGS. 5 and 6 each illustrate an example operation of FSM 118 for input data bit stream $d_{in1}$ and clock signal Clk1 using the state scheme described above with reference to FIG. 4 (again one of ordinary skill in the art will be able to readily apply the descriptions and principles illustrated with reference to FIGS. 5 and 6 to FSM 120 for input data bit stream $d_{in2}$ and clock signal Clk2). Again, it is assumed that CDR 100 has been configured for 3× oversampling, and thus, should obtain 3 samples per bit when the frequency of the signals match, and moreover, sample S1 should continually align with the center of each bit when the phase of the two signals match.

FIG. 5 illustrates an example operation of FSM 118 to track, acquire, and/or maintain the phase relationship between input data bit stream $d_{in1}$ and clock signal Clk1, while FIG. 6 illustrates an example operation of FSM 120 to track, acquire, and/or maintain the frequency relationship between input data bit stream $d_{in1}$ and clock signal Clk1.

Referring first to FIG. 5, input data bit stream $d_{in1}$ is represented, for explanatory purposes, as an alternating stream of "1s" and "0s." Clock signal Clk1 is represented, for explanatory purposes, by a series of arrows indicating the three sampling phase positions S0, S1, and S2. Additionally, the "1s" or "0s" within each "wave" represent the samples of input data bit stream $d_{in1}$ obtained by sampler 102. For reference purposes, a particular group of samples (e.g., sample S0, sample S1, and sample S2) is referred to herein as a sample set, each sample set being represented by a box in the "data transitions" chart.

As shown in FIG. 5, during the first three sample sets, the phase and frequency of clock signal Clk1 and input data bit stream $d_{in1}$ match. Consequently, each of the samples in each sample set have identical values and FSM 118 remains in state "0" during the first three sample sets. However, during the 4th sample set, a phase drift occurs between clock signal Clk1 and input data bit stream $d_{in}$', which causes the phase of clock signal Clk1 to lag behind the phase of input data bit stream $d_{in1}$ by ⅓ UI. Phase and frequency detector 108 detects this phase drift as a data transition between position S1 and S2,i and consequently transitions from state "0" to state "+1" to track the phase change. Clock signal Clk1 continues to lag behind input data bit stream $d_{in1}$ by ⅓ UI for the next 4 sample sets and therefore FSM 118 continues to remain in state "+1" for the next four sample sets. During this time, since FSM 118 is in a state that indicates that the clock signal Clk1 is slower than the data, an UP1 signal is asserted that increases the instantaneous frequency of clock signal Clk1, thus working to reduce the phase error.

By the ninth sample set, a second phase drift occurs between clock signal Clk1 and input data bit stream $d_{in1}$, which causes the phase of clock signal Clk1 to lag behind the phase of input data bit stream $d_{in1}$ by ⅔ UI. Phase and frequency detector 108 detects this phase drift as a data transition between position S0 and S1 and consequently transitions from state "+1" to state "+2" to track the phase change. Clock signal Clk1 continues to lag behind input data bit stream $d_{in1}$ by ⅔ UI for the next 2 sample sets and therefore FSM 118 continues to remain in state "+2" for the next 2 sample sets. Since clock signal Clk1 is still slower than input data bit stream $d_{in1}$ during this time, FSM 118 continues asserting the UP1 signal to reduce the phase error.

By the 12th sample set, due to the increase of the phase of Clk1 by assert the UP1 signal, the phase of clock signal Clk1 drifts back toward the phase of input data bit stream $d_{in1}$. In particular, at the 12th sample set, the phase of clock signal Clk1 increases by ⅓ UI and therefore lags behind the phase of input data bit stream $d_{in1}$ by ⅓ UI. Phase and frequency detector 108 detects this phase drift as a data transition between position S1 and S2,i and consequently transitions from state "+2" to state "+1" to track the phase change. A similar phase drift occurs at the 13th sample set which causes the phase of clock signal Clk1 to drift back toward the phase of input data bit stream $d_{in1}$ by another ⅓ UI and therefore the phase of clock signal Clk1 matches the phase of input data bit stream $d_{in1}$. Phase and frequency detector 108 detects this phase drift as a data transition between position S2,i−1 and S0 and consequently transitions from state "+1" to state "0" to track the phase change. At this point, the UP1 signal is de-asserted, after which, clock signal Clk1 remains in phase with input data bit stream $d_{in1}$ for the remainder of the sample sets and therefore FSM 118 continues to remain in state "0" for the remainder of the sample sets.

As described above, in particular embodiments, FSM 118 may assert one or more phase correction signals (e.g., UP1 and DN1) to alter the phase of the clock signal Clk1 to compensate for a phase difference between clock signal Clk1 and input data bit stream $d_{in1}$. While the illustrated embodiment was described with reference to the phase tracking abilities of FSM 118 for explanatory purposes, particular embodiments of phase and frequency detector 108 may assert one or more phase correction signals as soon as a phase discrepancy is detected between clock signal Clk1 and input data bit stream $d_{in1}$ to compensate for any such discrepancy. Thus, FSM 118 may actively maintain or acquire the phase of input data bit stream $d_{in1}$ rather than merely tracking a phase discrepancy between clock signal Clk1 and input data bit stream $d_{in1}$. Similarly, as FSM 118 and FSM 120 operate equivalently in particular embodiments, FSM 120 may actively maintain or acquire the phase of input data bit stream $d_{in2}$ rather than merely tracking a phase discrepancy between clock signal Clk2 and input data bit stream $d_{in2}$.

In particular situations (e.g., at startup), the frequency of clock signal Clk1 generated by VCO 106 may not match the frequency of input data bit stream $d_{in1}$. In particular embodiments, a frequency discrepancy between clock signal Clk1 and input data bit stream $d_{in1}$ will cause a gradual and consistent shift through the positive or negative states of FSM 118. Eventually, such shift causes an overflow or an underflow of FSM 118. In turn, FSM 118 may interpret such an overflow or underflow as a frequency discrepancy between clock signal Clk1 and input data bit stream $d_{in1}$ and may instruct phase and frequency detector 108 to iteratively assert one or more frequency correction signals (e.g., a FRUP1 signal or a FRDN1 signal) to adjust the frequency of clock signal Clk1 until FSM 118 stops underflowing or overflowing. By using an overflow or an underflow of FSM 118 to detect a frequency difference between clock signal Clk1 and input data bit stream $d_{in1}$, and by iteratively asserting frequency correction signals until such underflowing or overflowing of FSM 118 stops, CDR 100 may acquire the frequency of input data bit stream $d_{in1}$ without the use of a reference clock.

FIG. 6 illustrates an example situation in which FSM 118 is used to acquire the frequency of input data bit stream $d_{in1}$ during startup (e.g., when CDR 100 first receives input data bit stream $d_{in1}$). As shown, the frequency of clock signal Clk1 is greater than the frequency of input data bit stream $d_{in1}$; hence, sampler 102 is obtaining more than three samples (on average) of each bit in input data bit stream $d_{in1}$. As described above, when CDR 100 is properly calibrated for 3× oversampling, sampler 102 should obtain 3 samples per bit from input data bit stream $d_{in1}$.

To acquire the frequency of input data bit stream $d_{in1}$, FSM 118 begins in state "0" as a point of reference and begins tracking the data transitions as described above with reference to FIG. 5. However, the frequency discrepancy between clock signal Clk1 and input data bit stream $d_{in1}$ causes a series of data transitions, which, in turn, cause FSM 118 to gradually change states until FSM 118 underflows. More particularly, the frequency discrepancy between clock signal Clk1 and input data bit stream $d_{in1}$ causes FSM 118 to gradually transition from state "0" to state "−4." Once FSM 118 reaches state "−4" (e.g., at the 7th sample set) an underflow occurs. In response to the underflow, FSM 118 asserts a FRDN1 signal to increase the frequency of clock signal Clk1 and, in the illustrated example, transitions from state "−4" to state "−2."

After asserting the first FRDN1 signal, FSM 118 continues to track input data bit stream $d_{in1}$. However, the frequency of clock signal Clk1 is still greater than the frequency of input data bit stream $d_{in1}$. Consequently, at the 11th sample set, FSM 118 overflows a second time and accordingly asserts another FRUP1 signal to increase the frequency of clock signal Clk1 yet again. Subsequently, FSM 118 again transitions from state "−4" to state "−2" and continues to track input data bit stream $d_{in1}$.

After asserting the second FRDN1 signal, FSM 118 encounters two adjacent bits of identical value in input data bit stream $d_{in1}$ (e.g., a "1" adjacent to another "1"); however, FSM 118 continues to operate as described above until the next data transition occurs. Once the next data transition occurs, FSM 118 continues to track input data bit stream $d_{in1}$ as described above and will continue to underflow and assert FRDN1 signals until the frequency of clock signal Clk1 matches the frequency of input data bit stream $d_{in1}$. Once the frequency of clock signal Clk1 matches the frequency of input data bit stream $d_{in1}$, sampler 102 will repetitively obtain 3 samples per bit from input data bit stream $d_{in1}$ and phase and frequency detector 108 may operate in phase detection mode as described with respect to FIG. 5 to acquire the phase of input data bit stream $d_{in1}$. Subsequently, FSM 118 will converge toward state "0" by means of asserting an UP1 or DN1 signal.

It should be appreciated that, since phase and frequency detectors 108 and 110 operate simultaneously and independently assert phase and frequency correction signals that, in turn, affect both Clk1 and Clk2, the convergence of the frequency acquisition may occur more rapidly than would be possible using only one phase and frequency detector.

As described earlier, CDR 100 not only recovers the clock and individual data from input data bit streams $d_{in1}$ and $d_{in2}$, but also recombines the recovered bits from the two input data bit streams $d_{in1}$ and $d_{in2}$; that is, determines which bits from $d_{in1}$ and $d_{in2}$ correspond to the same corresponding symbols from the DQPSK symbol stream from which the bits in input data bit streams $d_{in1}$ and $d_{in2}$ were obtained and outputs these bits in the proper order as they were in the DQPSK symbol stream. Thus, one sample for each respective oversampled bit in each of input data bit streams $d_{in1}$ and $d_{in2}$ is selected and matched with the other corresponding to the same symbol from the DQPSK symbol stream.

To accomplish this, in the embodiment illustrated in FIG. 1, CDR 100 further includes sample selectors 124 and 126. Each of selectors 124 and 126 select one sample per oversampled bit in sample streams $d_{samp1}$ and $d_{samp2}$, respectively, sampled from input data bit stream $d_{in1}$ and input data bit stream $d_{in2}$, respectively, and outputs the selected samples as recovered data bit streams $d_{rec1}$ and $d_{rec2}$, respectively. Ideally, and in particular embodiments, the sample selected for a given bit corresponds to the center of the eye of the respective bit. To properly identify which samples to select, selectors 124 and 126 receive select signals SEL1 and SEL2, respectively, output from phase and frequency detectors 108 and 110, respectively. The SEL1 and SEL2 select signals indicate which of the three samples in each set of samples generated for a given bit in sample streams $d_{samp1}$ and $d_{samp2}$, respectively, best represents the true value of the respective bit (e.g., the sample for each bit determined to having been sampled closest to the center of the eye of the respective bit as detected by phase and frequency detectors 108 and 110, respectively).

In particular embodiments, CDR 100 further includes a data aligner or combiner 128 that aligns, interleaves, or combines the bits from recovered data bit streams $d_{rec1}$ and $d_{rec2}$ and generates one or more output streams $d_{out}$ in which the values and ordering of the bits in the output stream $d_{out}$ correspond to the values and ordering of the bits in the DQPSK symbol stream. By way of example, combiner 128 may combine recovered data bit streams $d_{rec1}$ and $d_{rec2}$ and output the combined bits onto an output bus having any number of wires (e.g., 1, 2, 4, 8, etc.) each carrying an output stream that comprises respective bits from collective output data bit stream $d_{out}$.

In addition to asserting phase and frequency corrections signals, FSM 118 and FSM 120 also output state signals STAT1 and STAT2, respectively, that indicate the instantaneous state of FSM 118 and FSM 120, respectively, where each state of FSM 118 and FSM 120, respectively, may indicate a particular degree of phase misalignment. As described above, each state in each of FSM 118 and FSM 120 may describe the position of a respective sample S1 relative to the center of the eye of the data in input data bit streams $d_{in1}$ and $d_2$, respectively, a change of more than one state at a time may result in one or more samples being skipped or missed in order to realign sample the respective samples S1 with the eye of the data. As described above, when operating within the range of state "−4" to state "+4," FSM 118 and FSM 120 may be configured to only assert phase correction signals which will only transition sequentially between states. However, as described below, FSM monitor 122 may monitor the states of each of FSM 118 and FSM 120 and, based on the difference in states between the FSM 118 and FSM 120, may assert control signals that cause one of phase and frequency detector 108 or phase and frequency detector 110 to either skip a bit or delay a bit in order to compensate for a situation in which the samples taken for the bits in input data bit streams $d_{in1}$ and $d_{in2}$ in a given clock cycle don't correspond to the same symbol.

More particularly, state signals STAT1 and STAT2 are supplied to FSM monitor 122, which may generate control signals F2UP3 or F2DN3 based on state signals STAT1 and STAT2. If FSM monitor 122 detects that the difference in the states of FSM 118 and FSM 120 (e.g., if FSM 118 is in state −3 and FSM 120 is in state +4, the difference would be 7), as determined by comparing STAT1 and STAT2, is on average larger than allowed, this indicates that the samples in each of $d_{samp1}$ and $d_{samp2}$ do not correspond to the concurrent UIs of the two input data bit streams $d_{in1}$ and $d_{in2}$. This scenario occurs as the phase differences between clock signals Clk1 and Clk2 and input data bit streams $d_{in1}$ and $d_{in2}$, respectively, are calculated independently of each other and because the two input data bit streams $d_{in1}$ and $d_{in2}$ have different data patterns. In particular embodiments, FSM monitor 122 estimates the average (DC) distance between the input data bit streams by low pass filtering the tracked instantaneous differences between the states of FSM 118 and FSM 120. If, for example, FSM monitor 122 detects that the average distance is above a threshold set slightly above 1.5 (UI/2 in time units for an oversampling factor of 3), it may assert signal F2UP3, which acts to reduce the average distance between the states in FSM 118 and FSM 120. Similarly, if the average distance is below the threshold of slightly below −1.5, it may assert F2DN3, which acts to increase the average distance between the states in FSM 118 and FSM 120. By performing the above action continuously, the FSM monitor 122 forces the average distance between the states in FSM 118 and FSM 120 to be in between −0.5 UI and +0.5 UI, and therefore that the contemporaneous output bit in streams $d_{rec1}$ and $d_{rec2}$ originate from the same symbol in the symbol stream.

As described above, the state of each of FSM 118 and FSM 120 represents the current sampling phase of the respective data bits, i.e. the position of the current data bit in the respective FIFO. As described above, phase correction signals (UP1, DN1, UP2, DN2) may be used to change the position of the current data bit by 1 (⅓ UI in time units for an oversampling factor of 3) when the detected phase is different than the current phase. However, the control signals F2UP3 and F2DN3 output by FSM monitor 122 cause the position of the current data bit in one of phase and frequency detector 108 or 110 to change by 3 (1 UI in time units for an oversampling factor of 3), thereby delaying or skipping a bit in the respective input data bit stream. In the illustrated embodiment, FSM monitor 122 may only send the control signals F2UP3 and F2DN3 to phase and frequency detector 110, as bits in only one of the input data bit streams need to be skipped or delayed to compensate for an average (DC) offset between the two input data bit streams. However, similar control signals may be sent to phase and frequency detector 108; that is, rather than skipping a bit in one of the input data bit streams, a bit in the other input data bit stream may be delayed by 1 UI (in effect, a bit may be inserted in the other data bit stream).

The present disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend.

The invention claimed is:

1. A method comprising:
receiving a first input data stream comprising first input data bits at an input frequency, the first input data bits in the first input data stream having been decoded from a symbol stream, each symbol in the symbol stream comprising at least a first symbol bit and a second symbol bit, each first input data bit comprising one of the first symbol bits;
generating a first clock signal having a clock frequency and n clock phases;
sampling the first input data stream at a rate of n samples per cycle of the first clock signal to generate a first sample stream, the first sample stream comprising one or more first samples for each first input data bit;
detecting a first phase difference between the first sample stream and the first clock signal to generate one or more first clock-correction signals and a first select signal;
receiving a second input data stream comprising second input data bits at the input frequency, the second input data bits in the second input data stream having been decoded from the symbol stream, each second input data bit comprising one of the second symbol bits;
generating a second clock signal having the clock frequency and n clock phases;
sampling the second input data stream at a rate of n samples per cycle of the second clock signal to generate a second sample stream, the second sample stream comprising one or more second samples for each second input data bit;
detecting a second phase difference between the second sample stream and the second clock signal to generate one or more second clock-correction signals and a second select signal;
adjusting the clock signals based at least in part on the first and second clock-correction signals;
generating a first recovered data stream by:
receiving the first sample stream; and
for each of the first input data bits, selecting one of its first samples based on the first select signal;

wherein the first recovered data stream comprises the selected ones of the first samples;
generating a second recovered data stream by:
receiving the second sample stream; and
for each of the second input data bits, selecting one of its second samples based on the second select signal;
wherein the second recovered data stream comprises the selected ones of the second samples; and
combining the first and second recovered data streams with each other to generate one or more output streams.

2. The method of claim 1, further comprising:
generating a first state signal representing a first direction and a first magnitude of the first phase difference;
generating a second state signal representing a second direction and a second magnitude of the second phase difference;
comparing the first and second state signals with each other; and
aligning the first and second input data streams with each other based on the comparison.

3. The method of claim 2, wherein detecting a first phase difference between the first sample stream and the first clock signal to generate one or more first clock-correction signals and a first select signal comprises:
for each cycle of the first clock signal:
determining whether or not a transition point between adjacent ones of the first input data bits occurs in the cycle;
when it is determined that a transition point occurs:
transitioning from a first state to a second state in a first state machine, the second state representing the first direction and the first magnitude of the first phase difference for the cycle;
generating a particular one of the first clock-correction signals based on the second state;
generating the first select signal based on the second state;
generating the first state signal based on the second state; and
for each cycle of the second clock signal:
determining whether or not a transition point between adjacent ones of the second input data bits occurs in the cycle;
when it is determined that a transition point occurs:
transitioning from a first state to a second state in a second state machine, the second state representing the second direction and the second magnitude of the second phase difference for the cycle;
generating a particular one of the second clock-correction signals based on the second state;
generating the second select signal based on the second state;
generating the second state signal based on the second state.

4. The method of claim 3, wherein:
for each cycle of the first clock signal,
determining the one of the first samples for each first input data bit was most closely sampled at a center of an eye of the first input data bit based on the second state;
wherein:
the first select signal indicates the one of the first samples determined to have been most closely sampled at the center of the eye;
selecting one of the first samples based on the first select signal comprises selecting the one of the first samples indicated by the first select signal; and
for each cycle of the second clock signal,
determining the one of the second samples for each second input data bit was most closely sampled at a center of an eye of the second input data bit based on the second state;
wherein:
the second select signal indicates the one of the second samples determined to have been most closely sampled at the center of the eye;
selecting one of the second samples based on the second select signal comprises selecting the one of the second samples indicated by the second select signal.

5. The method of claim 4, wherein:
comparing the first and second state signals with each other comprises:
determining an instantaneous difference between a value of the second state of the first FSM and a value of the second state of the second FSM; and
determining an average difference over a number of clock cycles; and
aligning the first and second input data streams with each other based on the comparison comprises skipping or delaying one or more of the selected ones of the first samples or the selected ones of the second samples when the average difference is greater than a threshold value.

6. The method of claim 5, wherein the value of n is an integer value greater than or equal to 3.

7. The method of claim 6, wherein:
each of the first and second state machines comprises 9 states collectively representing a span of 3 unit intervals;
each unit interval represents a time duration of one of the first or second input data bits;
each state is separated from an adjacent state by a value that represents a phase difference of ⅓ of a unit interval.

8. The method of claim 7 wherein the threshold value is a value that represents a ½ of a unit interval.

9. The method of claim 7, wherein:
first ones of the first clock-correction signals are generated when the transition from the first state to the second state of the first FSM is a transition from one of the 9 states in the first FSM to an adjacent one of the 9 states in the first FSM; and
first ones of the second clock-correction signals are generated when the transition from the first state to the second state of the second FSM is a transition from one of the 9 states in the second FSM to an adjacent one of the 9 states in the second FSM.

10. The method of claim 9, wherein:
second ones of the first clock-correction signals are generated when a transition from the first state to a different second state of the first FSM cannot occur indicating an overflow or underflow of the first FSM; and
second ones of the second clock-correction signals are generated when a transition from the first state to a different second state of the second FSM cannot occur indicating an overflow or underflow of the second FSM.

11. The method of claim 1, wherein the first and second symbol bits comprise Differential Quadrature Phase Shift Keying (DQPSK) modulated data bits.

12. A circuit comprising:
a clock generator operable to generate a first clock signal having a clock frequency and n clock phases and a second clock signal having the clock frequency and n clock phases;

a first phase and frequency detection circuit operable to:
  receive a first input data stream comprising first input data bits at an input frequency, the first input data bits in the first input data stream having been decoded from a symbol stream, each symbol in the symbol stream comprising at least a first symbol bit and a second symbol bit, each first input data bit comprising one of the first symbol bits;
  receive the first clock signal;
  sample the first input data stream at a rate of n samples per cycle of the first clock signal to generate a first sample stream, the first sample stream comprising one or more first samples for each first input data bit;
  detect a first phase difference between the first sample stream and the first clock signal to generate one or more first clock-correction signals and a first select signal;
  adjust the first clock signal based at least in part on the first clock-correction signals;
  generate a first recovered data stream, wherein to generate the first recovered data stream the first phase and frequency detection circuit is operable to:
    receive the first sample stream; and
    for each of the first input data bits, select one of its first samples based on the first select signal;
    wherein the first recovered data stream comprises the selected ones of the first samples;
a second phase and frequency detection circuit operable to:
  receive a second input data stream comprising second input data bits at the input frequency, the second input data bits in the second input data stream having been decoded from the symbol stream, each second input data bit comprising one of the second symbol bits;
  receive the second clock signal;
  sample the second input data stream at a rate of n samples per cycle of the second clock signal to generate a second sample stream, the second sample stream comprising one or more second samples for each second input data bit;
  detect a second phase difference between the second sample stream and the second clock signal to generate one or more second clock-correction signals and a second select signal;
  adjust the second clock signal based at least in part on the second clock-correction signals;
  generate a second recovered data stream, wherein to generate the second recovered data stream the second phase and frequency detection circuit is operable to:
    receive the second sample stream; and
    for each of the second input data bits, select one of its second samples based on the second select signal;
    wherein the second recovered data stream comprises the selected ones of the second samples; and
a combining circuit operable to combine the first and second recovered data streams with each other to generate one or more output streams.

13. The circuit of claim 12, wherein:
the first phase and frequency detection circuit is operable to generate a first state signal representing a first direction and a first magnitude of the first phase difference;
the second phase and frequency detection circuit is operable to generate a second state signal representing a second direction and a second magnitude of the second phase difference;
the combining circuit is operable to:
  compare the first and second state signals with each other; and
  align the first and second input data streams with each other based on the comparison.

14. The circuit of claim 13, wherein:
to detect a first phase difference between the first sample stream and the first clock signal to generate one or more first clock-correction signals and a first select signal the first phase and frequency detection circuit is operable to, for each cycle of the first clock signal:
  determine whether or not a transition point between adjacent ones of the first input data bits occurs in the cycle;
  when it is determined that a transition point occurs:
    transition from a first state to a second state in a first state machine, the second state representing the first direction and the first magnitude of the first phase difference for the cycle;
    generate a particular one of the first clock-correction signals based on the second state;
    generate the first select signal based on the second state;
    generate the first state signal based on the second state; and
to detect a second phase difference between the second sample stream and the second clock signal to generate one or more second clock-correction signals and a second select signal the second phase and frequency detection circuit is operable to, for each cycle of the second clock signal:
  determine whether or not a transition point between adjacent ones of the second input data bits occurs in the cycle;
  when it is determined that a transition point occurs:
    transition from a first state to a second state in a second state machine, the second state representing the second direction and the second magnitude of the second phase difference for the cycle;
    generate a particular one of the second clock-correction signals based on the second state;
    generating the second select signal based on the second state;
    generate the second state signal based on the second state.

15. The circuit of claim 14, wherein:
to detect a first phase difference between the first sample stream and the first clock signal to generate one or more first clock-correction signals and a first select signal the first phase and frequency detection circuit is operable to, for each cycle of the first clock signal:
  determine the one of the first samples for each first input data bit was most closely sampled at a center of an eye of the first input data bit based on the second state;
  wherein:
    the first select signal indicates the one of the first samples determined to have been most closely sampled at the center of the eye;
    to select one of the first samples based on the first select signal the first phase and frequency detection circuit is operable to select the one of the first samples indicated by the first select signal; and
to detect a second phase difference between the second sample stream and the second clock signal to generate one or more second clock-correction signals and a second select signal the second phase and frequency detection circuit is operable to, for each cycle of the second clock signal:

determine the one of the second samples for each second input data bit was most closely sampled at a center of an eye of the second input data bit based on the second state;

wherein:

the second select signal indicates the one of the second samples determined to have been most closely sampled at the center of the eye;

to select one of the second samples based on the second select signal the second phase and frequency detection circuit is operable to select one of the second samples based on the second select signal comprises selecting the one of the second samples indicated by the second select signal.

16. The circuit of claim 15, wherein:

to compare the first and second state signals with each other, the combining circuit is operable to:

determine an instantaneous difference between a value of the second state of the first FSM and a value of the second state of the second FSM; and determine an average difference over a number of clock cycles; and to align the first and second input data streams with each other based on the comparison, the combining circuit is operable to skip or delay one or more of the selected ones of the first samples or the selected ones of the second samples when the average difference is greater than a threshold value.

17. The circuit of claim 16, wherein the value of n is an integer value greater than or equal to 3.

18. The circuit of claim 17, wherein:

each of the first and second state machines comprises 9 states collectively representing a span of 3 unit intervals;

each unit interval represents a time duration of one of the first or second input data bits;

each state is separated from an adjacent state by a value that represents a phase difference of $\frac{1}{3}$ of a unit interval.

19. The circuit of claim 18 wherein the threshold value is a value that represents a $\frac{1}{2}$ of a unit interval.

20. The circuit of claim 18, wherein:

first ones of the first clock-correction signals are generated when the transition from the first state to the second state of the first FSM is a transition from one of the 9 states in the first FSM to an adjacent one of the 9 states in the first FSM; and first ones of the second clock-correction signals are generated when the transition from the first state to the second state of the second FSM is a transition from one of the 9 states in the second FSM to an adjacent one of the 9 states in the second FSM.

21. The circuit of claim 20, wherein:

second ones of the first clock-correction signals are generated when a transition from the first state to a different second state of the first FSM cannot occur indicating an overflow or underflow of the first FSM; and second ones of the second clock-correction signals are generated when a transition from the first state to a different second state of the second FSM cannot occur indicating an overflow or underflow of the second FSM.

22. The circuit of claim 12, wherein the first and second symbol bits comprise Differential Quadrature Phase Shift Keying (DQPSK) modulated data bits.

* * * * *